United States Patent [19]
Wu

[11] Patent Number: 6,121,080
[45] Date of Patent: Sep. 19, 2000

[54] ELECTRONIC DISCHARGE PROTECTIVE CIRCUIT FOR DRAM

[75] Inventor: Tsung-Chih Wu, Hsinchu Hsien, Taiwan

[73] Assignee: United Microelectronics Corp., Hsinchu, Taiwan

[21] Appl. No.: 09/187,901

[22] Filed: Nov. 6, 1998

[51] Int. Cl.[7] .............................................. H01L 21/8244
[52] U.S. Cl. ........................ 438/238; 438/238; 438/275; 438/210; 438/253; 438/302; 438/396
[58] Field of Search ..................................... 438/275, 302, 438/200, 238, 396, 253, 210

[56] References Cited

U.S. PATENT DOCUMENTS

| | | | |
|---|---|---|---|
| 5,637,187 | 6/1997 | Takasu | 438/30 |
| 5,843,827 | 12/1998 | Gregor | 438/301 |
| 5,994,176 | 11/1999 | Wu | 438/200 |
| 5,994,755 | 11/1999 | Dejong et al. | 257/500 |
| 6,008,081 | 11/1999 | Wu | 438/210 |

*Primary Examiner*—David Nelms
*Assistant Examiner*—Phuc Dang
*Attorney, Agent, or Firm*—Thomas, Kayden, Horstemeyer & Risley

[57] ABSTRACT

A method of manufacturing an electrostatic discharge protective circuit for DRAM is disclosed. In the market, two gates are first formed on a substrate. A silicon oxide layer is formed over the substrate. Next, a contact window is formed in the silicon oxide layer to expose a common source/drain region between the two gates in the substrate and parts of the two gates. Since the two gates are formed at the same time, there is no problem with alignment accuracy in the formation of the contact window therebetween. Then, the contact window is filled by a conductive material, such as doped polysilicon, which is used to electrically connect the two gates and the common source/drain region.

14 Claims, 4 Drawing Sheets

ELECTRONIC DISCHARGE PROTECTIVE CIRCUIT FOR DRAM

BACKGROUND OF THE INVENTION

1. Field of the Invention

The invention relates to a dynamic random access memory (DRAM), and more particularly to a method of manufacturing an electrostatic discharge (ESD) protective circuit for DRAM for preventing current leakage and an operational error.

2. Description of the Related Art

In IC processing, electrostatic discharge has been a main factor causing damage to ICs including deep sub-micron ICs. Therefore, it is urgently desired to increase the efficacy of electrostatic discharge protective circuits in the semiconductor industry.

Generally, in a process for manufacturing a DRAM with a conventional capacitor over bit-line (COB) structure, an electrostatic discharge (ESD) protective circuit for protecting the DRAM against damage from an electrostatic discharge is formed therein. Referring to FIG. 1, an electrostatic discharge protective circuit for DRAM is shown. In FIG. 1, the gate of an MOS transistor 10 is electrically coupled to the source (or drain) thereof and then to ground Vss. The drain (or source) of the MOS transistor 10 is electrically coupled to an internal circuit 20 and in input port INP. With regard to the operation of the electrostatic discharge protective circuit, when the potential of a signal or electrostatic charges on the input port INP is located within a safe range, the signal or the electrostatic charges can be directly transmitted into the internal circuit 20. On the other hand, if the potential of the signal or the electrostatic charges is greater than a critical value, a larger current generated is discharged to the ground Vss via the MOS transistor 10 by the hot electron effect and cannot flow into the internal circuit 10. Thus, the internal circuit 10 can be protected from damage.

However, the electric connection between the gate and source (or drain) of the MOS transistor 10 in the prior electrostatic discharge protective circuit is performed by using interconnections. Therefore, its layout takes a relatively larger space, resulting in a lower integration. To resolve this problem, a method of manufacturing an electrostatic discharge protective circuit, which takes a less space, shown in FIGS. 2A–2D is introduced. FIGS. 2A–2D are schematic cross-sectional views showing a method of manufacturing an electrostatic discharge protective circuit and a capacitor for DRAM.

Referring to FIG. 2A, a P-type semiconductor substrate 30 is provided. Device isolation regions 40, such as shallow trench isolation regions or field oxide regions, are formed on the substrate 30. An oxide layer and a polysilicon layer (not shown) are formed in order over the substrate 30, and then patterned to form a gate 70a consisting of a gate oxide layer 50a and a poly gate 60a. Next, using the gate 70a as a mask, $N^+$-type source/drain regions 80b and 80c are formed in the substrate on both sides of the gate 70a by, for example, ion implanting.

Referring to FIG. 2B, a silicon oxide layer (not shown) is formed over the substrate 30, and then anisotropically etched thereby to form spacers 90 on the vertical sides of the gate 70a.

Referring to FIG. 2C, at least one dielectric layer 100, such as a silicon oxide layer or BPSG, is formed over the substrate 30. The dielectric layer 100 is then patterned by photolithography and etching, thereby forming two contact windows 110 that expose the source/drain regions 80b and 80c and a contact window 105. Contact window 105 divides the gate 70a into two gates 70b and 70c consisting of gate oxide layers 50b and 50c and polysilicon layers 60b and 60c. Subsequently, parts of the substrate 30 exposed through the contact window 105 are ion implanted thereby to form a common $N^+$-type source/drain region 85 between the gates 70b and 70c.

However, in this step, there may be a deviation of alignment accuracy (AA) during photolithography and etching. For example, the common source/drain region 85 deviates slightly towards the gate 70c, resulting in a short channel between the common source/drain region 85 and the drain region 80c. Thus, the safe voltage that can be inputted to an internal circuit for a signal is lowered, causing a current leakage. If the safe voltage is greatly reduced, an operational error can occur. As to the lengthened channel between the common source/drain region 85 and the source region 80b making the safe voltage increase, it is undesirable for original circuit designs.

Referring to FIG. 2D, a conductive layer (not shown), such as a tungsten layer, is formed over the substrate 30 by, for example, chemical vapor deposition. Then, the conductive layer is patterned thereby to form two first conductive lines 120 and a second conductive line 121 in the contact windows 110 and 105, respectively, to electrically connect the source/drain 80b and 80c and the common source/drain region 85, respectively. Thus, the electrostatic discharge protective circuit for DRAM is completely manufactured.

As can be seen from the above, in the prior method of manufacturing an electrostatic discharge protective circuit for DRAM, the two gates and the common source/drain region are electrically connected to each other at one time by using the contact window between two gates. However, a deviation of alignment accuracy is inevitable and can shorten the channel between the common source/drain region and the source region or the drain region, causing a current leakage and even an operational error.

SUMMARY OF THE INVENTION

In view of the above, an object of the invention is to provide a method of manufacturing an electrostatic discharge protective circuit for DRAM where not only can two gates be electrically connected to a common source/drain region by using a common contact window formed between the two gates, as in the prior art, but also the deviation of the formed common source/drain region which shortens a corresponding channel, causing a current leakage, is effectively prevented.

The method of manufacturing an electrostatic discharge protective circuit for DRAM includes the following steps. First, two gates are formed on a substrate. A dielectric layer is formed over the substrate. Then, a contact window is formed to expose a common source/drain region between the gates and parts of the gates by patterning the dielectric layer. Since the two gates are formed at the same time, there is no problem with alignment accuracy during the formation of the common source/drain region. Next, a conductive layer, such as a doped polysilicon layer, is formed in the contact window to electrically connect the two gates and the common source/drain region.

BRIEF DESCRIPTION OF THE DRAWINGS

The invention will be more fully understood from the detailed description given hereinbelow and the accompanying drawings which are given by way of illustration only, and thus do no limit the present invention, and wherein.

DETAILED DESCRIPTION OF THE PREFERRED EMBODIMENTS

FIGS. 3A–3D are cross-sectional views showing a method of manufacturing an electrostatic discharge protective circuit and a capacitor according to a preferred embodiment of the invention.

Figure 1:
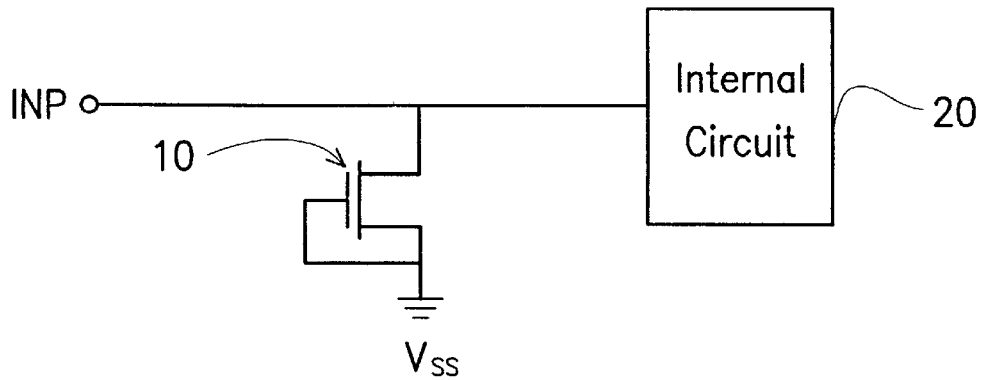
FIG. 1 is a circuit diagram showing an electrostatic discharge protective circuit for DRAM.
Figure 2A:
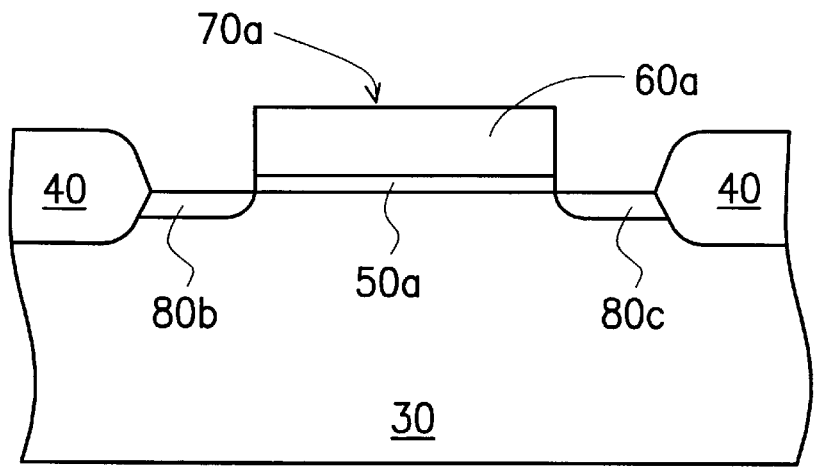
FIGS. 2A–2D are schematic, cross-section views showing a method of manufacturing an electrostatic discharge protective circuit and a capacitor for DRAM according to the prior art.
Figure 2B:
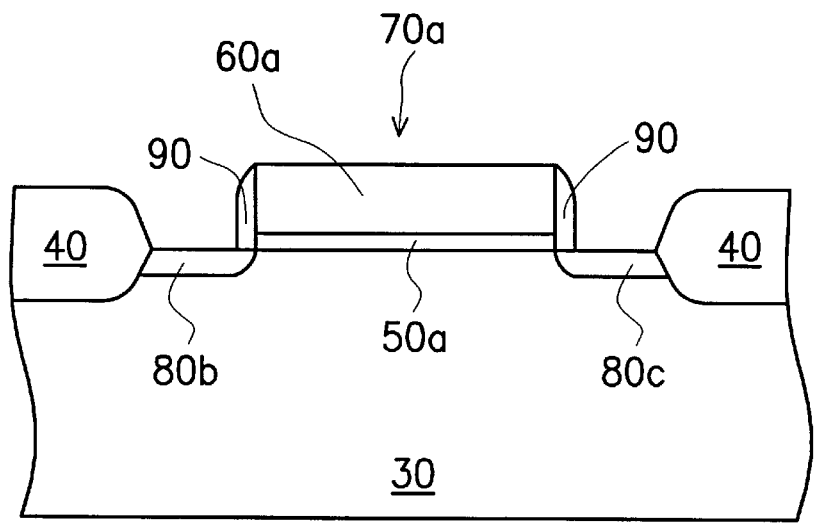
Figure 2C:
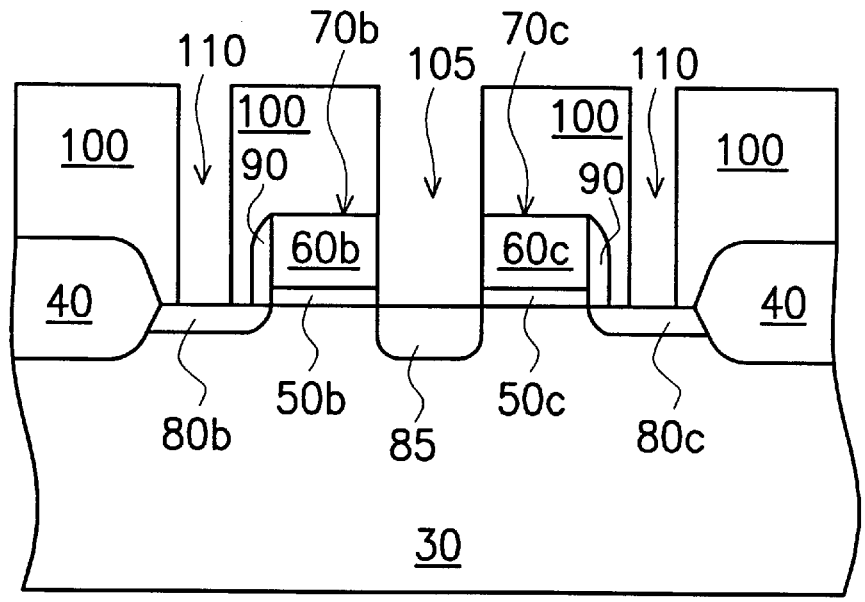
Figure 2D:
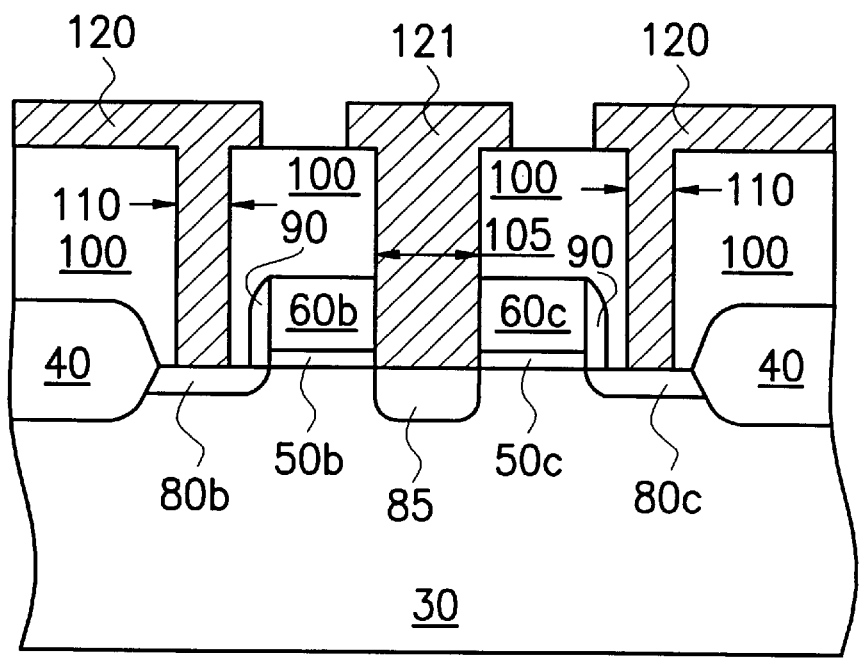
Figure 3A:
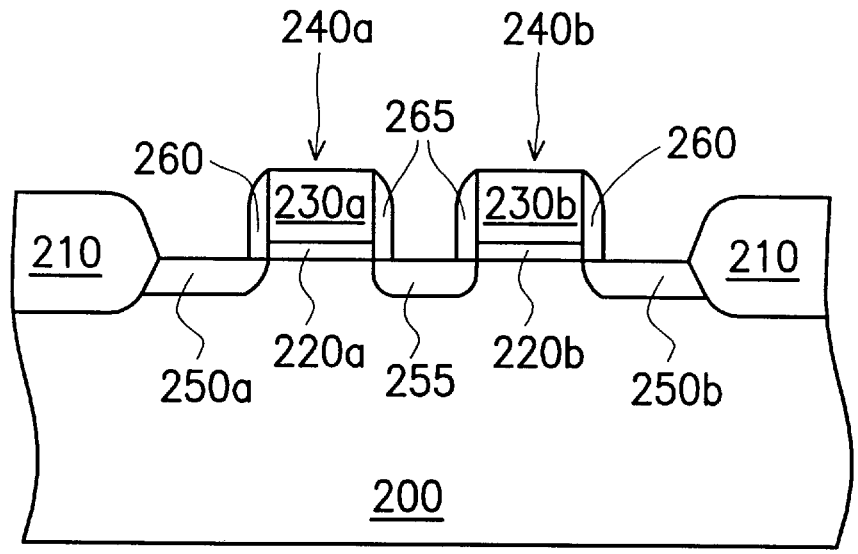
FIGS. 3A–3D are schematic, cross-sectional views showing a method of manufacturing an electrostatic discharge protective circuit and a capacitor according to a preferred embodiment of the invention.

Referring to FIG. 3A, a P-type semiconductor substrate 200 is provided. Two device isolation regions 210, such as shallow trench isolation regions or field oxide regions, are formed on the substrate 200. Then, a gate layer (not shown) consisting of an oxide layer and a polysilicon layer, in that order, is formed over the substrate 200. The oxide layer and the polysilicon layer are patterned to form two gates 240a and 240b consisting of gate oxide layers 220a and 220b and polysilicon gates 230a and 230b. Subsequently, using the two gates 240a and 240b as masks, an $N^+$-type common source/drain region 255 is formed in the substrate 200 between the two gates 240a and 240b, and $N^+$-type source/drain regions 250a and 250b are formed in the substrate 200 on the outsides of the two gates 240a and 240b by, for example, ion implanting with higher concentration of ions such as N-type ions. A silicon oxide layer (not shown) is formed over the substrate 200, and then etched back thereby to form two outside spacers 260 and two inside spacers 265 on the vertical sides of the two gates 240a and 240b by anisotropic etching.

Figure 3B:
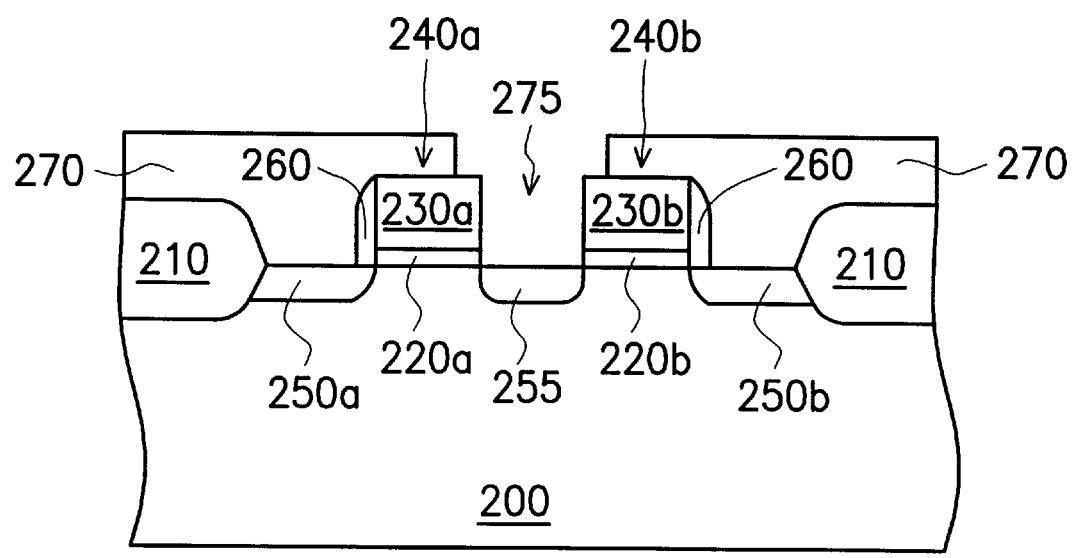

Referring to FIG. 3B, a first dielectric layer 270, such as a silicon oxide layer, is formed over the substrate 200 by, for example, chemical vapor deposition using tetra-ethyl-ortho-silicate (TEOS) as a reaction gas source. Then, a first contact window 275 is formed in the silicon oxide layer 270 to expose the common source/drain region 255 and parts of the two gates 240a and 240b by photolithography and etching. At the same time, the inside spacers 265 are removed because the silicon oxide layer 270 and the inside spacers 265 are made from the same material. Furthermore, since the selective etching rate ratio of the silicon oxide layer to the polysilicon-gates 230a and 230b is much higher, the first contact window 275 is automatically aligned with the common source/drain region 255 during etching.

Figure 3C:
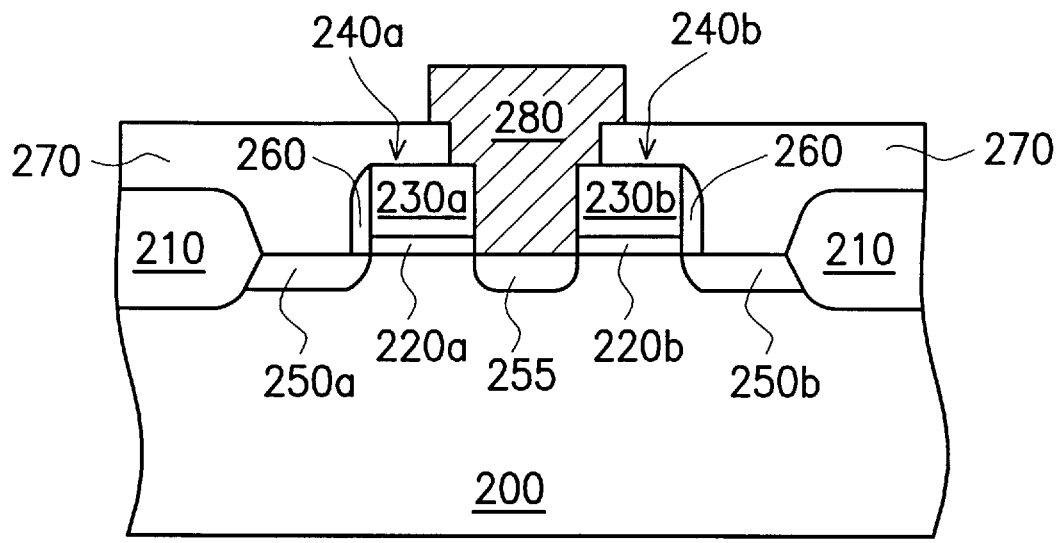

Referring to FIG. 3C, a conductive layer (not shown), such as a doped polysilicon layer, is formed over the substrate 200 and completely fills the first contact window 275 (FIG. 3B). Then, the conductive layer is patterned by photolithography and etching thereby to form a first conductive line 280 in the first contact window 275 for connecting the two gates 240a and 240b and the common source/drain region 255.

Figure 3D:
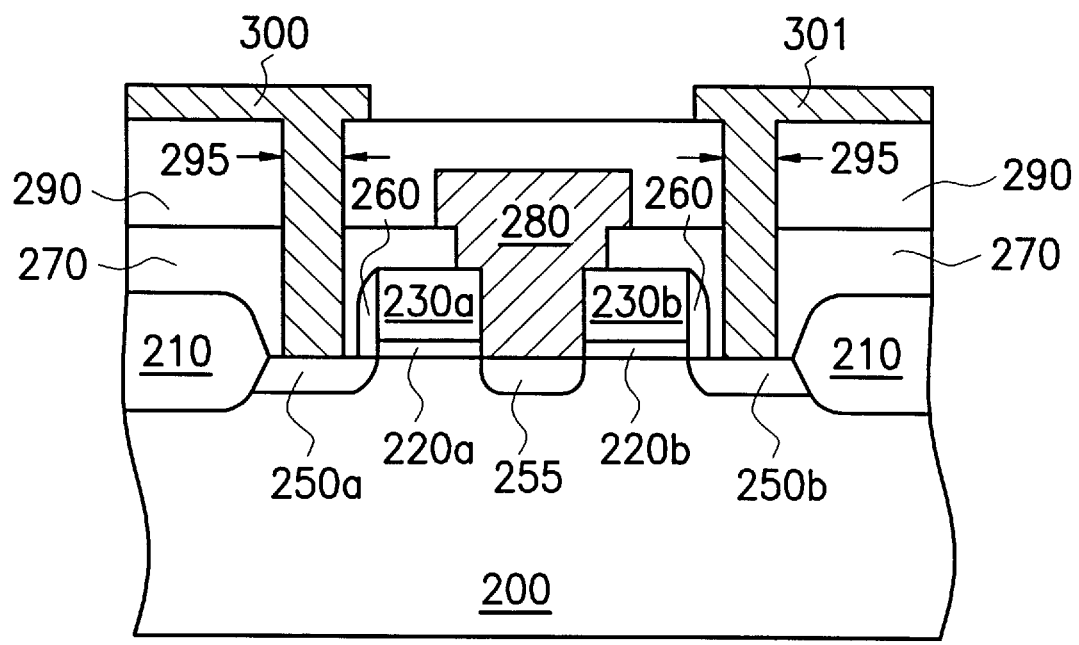

Referring to FIG. 3D, at least one second dielectric layer 290, such as a silicon oxide layer or BPSG, is formed over the substrate 200. Two contact windows 295 are formed in the second dielectric layer 290 to expose the source/drain regions 250a and 250b by patterning the dielectric layer 290.

Thereafter, a conductive layer (not shown) is formed over the substrate 200 and completely fills the two contact windows 295. Then, a second conductive line 300 and a third conductive line 301 are formed in the two contact windows 295 to electrically connect the source/drain 250a and 250b, respectively. Thus, the electrostatic discharge protective circuit for DRAM in accordance with the invention is completely manufactured.

As can be seen from the above, since the two gates 240a and 240b are formed at the same time, the channels of two MOS transistors can keep their originally designed lengths. Therefore, the invention can efficiently prevent a short channel which would cause an operational error.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of manufacturing an electrostatic discharge protective circuit for DRAM on a substrate on which a gate layer and two device isolation regions on both sides of the gate layer are already formed, comprising the steps of:

forming a first gate and a second gate by patterning the gate layer;

forming a common source/drain region between and adjacent to the first gate and the second gate and source/region regions on the outside of the first gate and the second gate in the substrate by ion implanting with the first gate and the second gate serving as masks;

forming a first dielectric layer over the substrate;

forming a first contact window to expose the common source/drain region and parts of the first gate and the second gate by patterning the first dielectric layer;

forming a first polysilicon layer in the first contact window to electrically connect the first gate, the second gate and the common source/drain region;

forming a second dielectric layer over the substrate;

forming two second contact windows to expose the source/drain regions, respectively, by patterning the second dielectric layer; and forming a first conductive line and a second conductive line in the two second contact windows, respectively.

2. The method of manufacturing an electrostatic discharge protective circuit as claimed in claim 1, wherein the device isolation regions can be field oxide regions.

3. The method of manufacturing an electrostatic discharge protective circuit as claimed in claim 1, wherein the device isolation regions can be shallow trench isolation regions.

4. The method of manufacturing an electrostatic discharge protective circuit as claimed in claim 1, wherein each of the first gate and the second gate consists of a gate oxide layer and a polysilicon gate.

5. The method of manufacturing an electrostatic discharge protective circuit as claimed in claim 1, wherein the first dielectric layer is formed by chemical vapor deposition and comprises a silicon oxide layer.

6. The method of manufacturing an electrostatic discharge protective circuit as claimed in claim 5, wherein the silicon oxide layer is formed by chemical vapor deposition using tetra-ethyl-ortho-silicate (TEOS) as a reaction gas source.

7. The method of manufacturing an electrostatic discharge protective circuit as claimed in claim 1, wherein a method of patterning the first dielectric layer comprises the steps of:

forming a photoresist layer with a trench opposite the subsequently-formed first contact window on the first dielectric layer by photolithography; and anisotropically etching the first dielectric layer to form the first contact window.

8. The method of manufacturing an electrostatic discharge protective circuit as claimed in claim 1, wherein the polysilicon layer can be formed by low pressure chemical vapor deposition.

9. The method of manufacturing an electrostatic discharge protective circuit as claimed in claim 1, wherein the second dielectric layer is BPSG.

10. The method of manufacturing an electrostatic discharge protective circuit as claimed in claim 1, wherein the step of patterning the second dielectric layer is performed by photolithography and etching.

11. The method of manufacturing an electrostatic discharge protective circuit as claimed in claim 1, wherein the first and second conductive lines comprise tungsten layers.

12. The method of manufacturing an electrostatic discharge protective circuit as claimed in claim 1, wherein the first and second conductive lines can be formed by chemical vapor deposition.

13. The method of manufacturing an electrostatic discharge protective circuit as claimed in claim 1, after the step of forming the first gate and the second gate further comprising:

forming a third dielectric layer over the substrate; and removing part of the third dielectric layer to form spacers on the vertical sides of the first gate and the second gate.

14. The method of manufacturing an electrostatic discharge protective circuit as claimed in claim 13, wherein spacers directly on the common source/drain region are simultaneously removed during the step of patterning the first dielectric layer.

* * * * *